United States Patent [19]

Yamashita et al.

[11] Patent Number: 5,539,833
[45] Date of Patent: Jul. 23, 1996

[54] AUDIO SIGNAL AMPLIFIER DEVICE

[76] Inventors: Osamu Yamashita; Toshimi Furukawa, both of 1362-1, Kumano, Enzan-shi, Yamanashi 404, Japan

[21] Appl. No.: 327,553

[22] Filed: Oct. 24, 1994

[51] Int. Cl.⁶ ............................. H03G 5/00; H03F 3/68; H03F 3/26; H03H 5/00
[52] U.S. Cl. .................... 381/98; 330/124 R; 330/295; 330/276; 333/28 T
[58] Field of Search ............................ 381/98, 101, 102, 381/103, 106, 109, 97, 59; 333/14, 28 R, 28 T; 330/295, 124 R, 124 D, 84, 133, 276

[56] References Cited

U.S. PATENT DOCUMENTS

| | | | |
|---|---|---|---|
| 1,965,720 | 7/1934 | Nicolson | 381/98 |
| 3,539,725 | 7/1968 | Hellwarth | 381/98 |
| 4,081,757 | 3/1978 | Rumbaugh | 330/84 |
| 5,264,810 | 11/1993 | Sager et al. | 330/295 |
| 5,323,277 | 6/1994 | Sugibayashi | 381/98 |

FOREIGN PATENT DOCUMENTS 0052544 10/1981 France ..................... 381/102

58-170196 10/1983 Japan ...................... 381/98

*Primary Examiner*—Forester W. Isen
*Assistant Examiner*—Xu Mei
*Attorney, Agent, or Firm*—Wenderoth, Lind & Ponack

[57] ABSTRACT

An audio signal amplifier device is disclosed, and includes two parallel compass controller circuits (6, 7), each of the circuits (6, 7) having the identical configuration and including a low compass controlling circuit (1, 8) having a plurality of transformers $T_1$, $T_2$ connected in series, a medium compass controlling circuit (2, 9) having a capacitor $C_2$ and a resistor $R_3$ connected in series, and a high compass controlling circuit (3, 10) having a capacitor $C_3$ and an amplifier $A_2$ connected in series, those three compass controlling circuits being coupled in parallel.

The parallel compass controller circuits (6, 7) are connected in series through a pre-amplifier $PA_1$, wherein the post-stage circuit (7) is coupled with an output transformer $T_4$ through a pre-amplifier $PA_3$, and the pre-stage circuit (6) is coupled with an input transformer $T_3$ through a pre-amplifier $PA_2$.

3 Claims, 8 Drawing Sheets

FIG. 5(a)
PRIOR ART
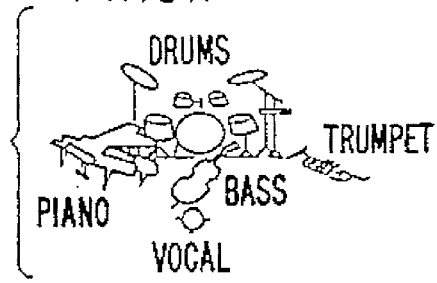
FIG. 5(b)
PRIOR ART
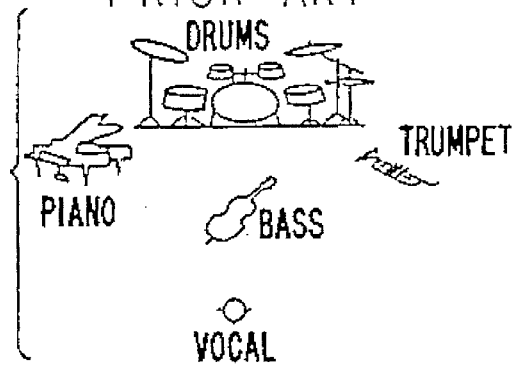
FIG. 5(c)

FIG. 7
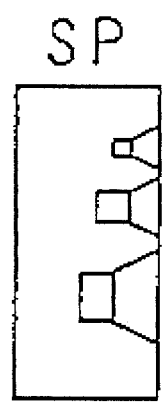
SP
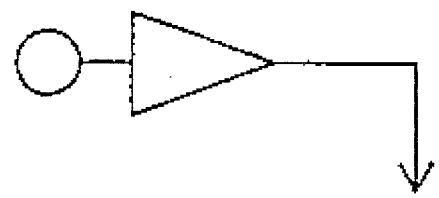
MIC AMP
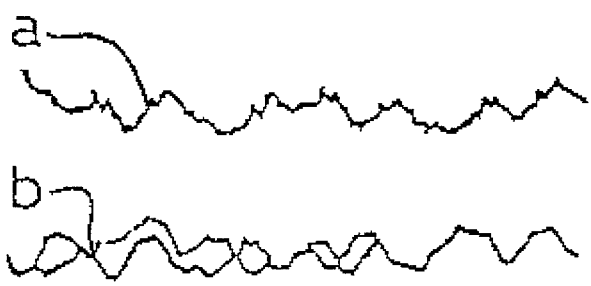
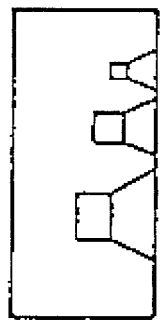
SP
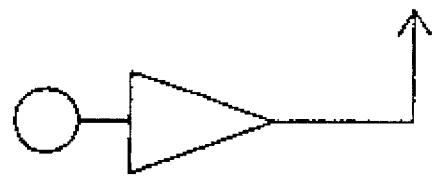
MIC AMP
PRIOR ART

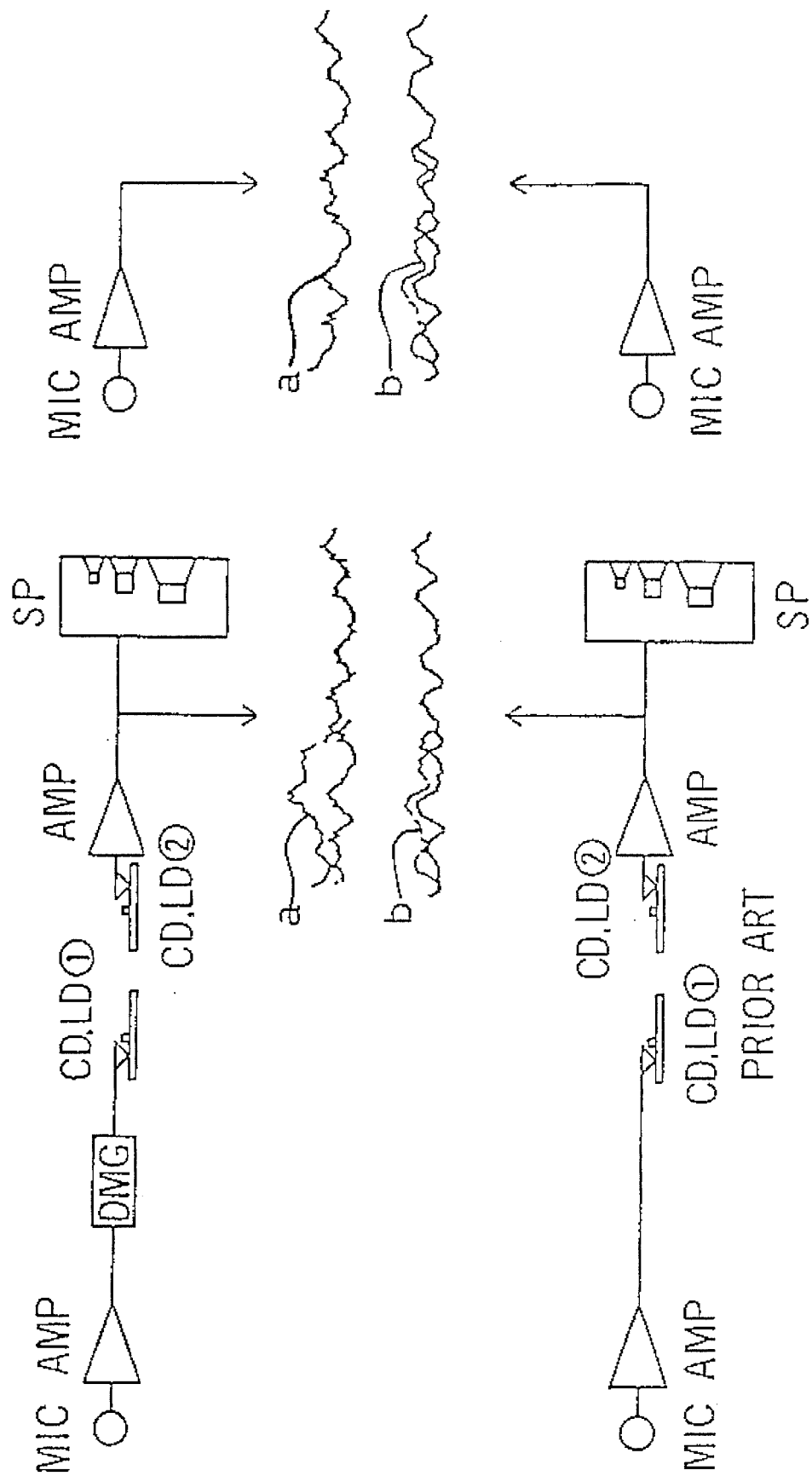

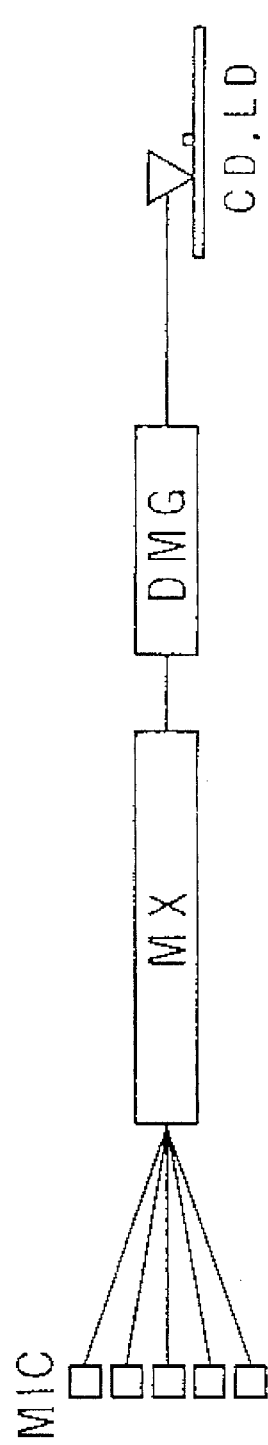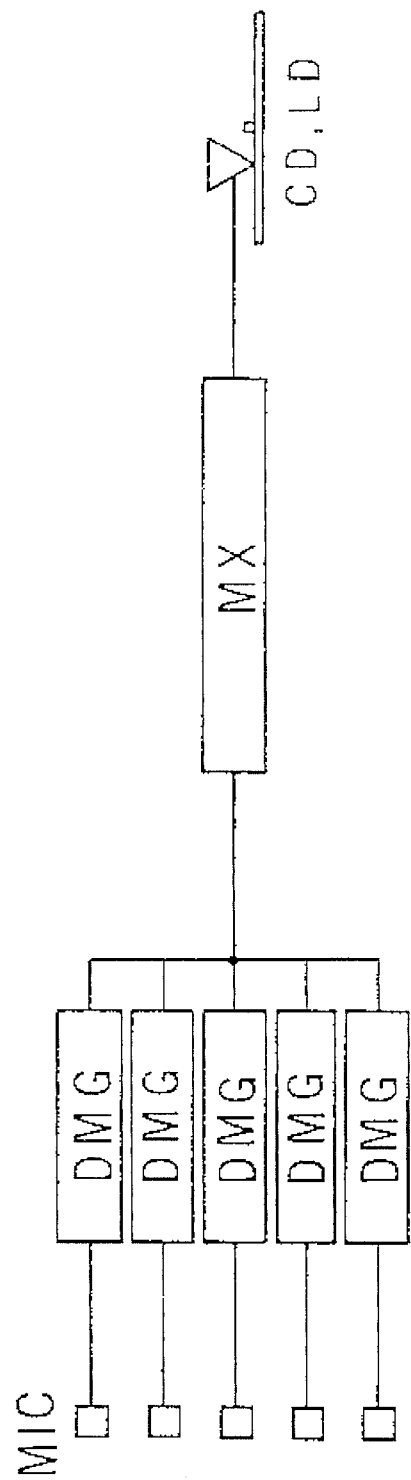
FIG. 9(a)
FIG. 9(b)

AUDIO SIGNAL AMPLIFIER DEVICE

BACKGROUND OF THE INVENTION

Field of the Invention

The present invention relates to an audio signal amplifier device, and more particularly to an apparatus that is capable of amplifying input audio signal according to the particular audio signal component corresponds to a compass of sound and contained in the input audio signal, such as the audio signal components correspond to the sound of low, medium or high compass, and by controlling the each respective input audio signals corresponds to the different compass of sound through the appropriate audio signal controlling circuits connected in parallel.

Description of the Prior Art

Conventional techniques for amplifying audio signals are known in the audio signal processing field, and are implemented by using various amplifier circuits. Those techniques and circuits are designed to reproduce original sounds with high fidelity.

For example, there is the reproduction technique known as the sound system that may be used to reproduce the sound recorded on the magnetic tape. In the other known reproduction technique, the low and high compass components contained in the original sound are emphasized when the sound is recorded on the magnetic tape, and when the sound on the magnetic tape is reproduced, the low and high compass components that have been emphasized when being recorded are attenuated sufficiently so that the noise effects can be minimized.

Those conventional reproduction techniques have accomplished some success, respectively, but each of them employs the speaker system that provides the sound by converting the electrical signal into the corresponding audible sound waves. The sound that has been reproduced in this way is not as true as the original sound.

The speaker system includes a two-way speaker system or a three-way speaker system that may be employed in the conventional reproduction techniques. In the speaker system, each speaker produces an acoustic wave having a different audio frequency range that travels through the air to the point where the listener is located. In the conventional reproduction techniques, it was seemed, when a acoustic wave from each of the speakers travels over a given distance through the air to the listener's location, a time difference occurs when the sound of low compass and the sound of high compass reach the listener's location. So that, the prior art designs have been based upon the assumption that the listener can identify the sounds of different compass from this time difference that occurs when the sound of different compasses reach the listener's location.

In order to cancel the effect caused by the difference that occurs when the sounds of different compass reach the listener, an attempt has been made to locate the speaker for the sound of low compass nearer to the audience and locate the speaker for the sound of high compass farther from the audience in the rock & roll music concert site. In the two-way speaker system or three-way speaker system, a combination of the bandpass filter and delay circuit has been employed to permit the sound from the speaker for the low compass and the sound from the speaker for the high compass to reach the listener's location simultaneously. Those two improvements attempted to reproduce the original sound with the high fidelity, as disclosed in the respective Japanese Utility Model Registration applications which were laid open to public inspection under the publication No. 63-41994 and No. 59-177293, but it is found that the high-fidelity reproduction cannot yet be attained completely.

An alternative solution is proposed to address the above problem. In this proposed solution, discrete subcircuits are arranged in the audio signal processing circuit, wherein those discrete subcircuits are designed to process the different input audio signal components, such as the audio signal component corresponds to the low compass, the audio signal component corresponds to the medium compass and the audio signal component corresponds to the high compass, and to provide the respective outputs separately to be transmitted to the respective speakers. This system is known as the equalizer or stereo-equalizer which permits the audio signal component corresponds to the low compass output to be transmitted to the respective speaker faster so that the sound wave of the low compass which is converted from said audio signal by said speaker can reach the listener at the same time as the other sound waves of the medium or high compasses reach the listener. This system is thus designed to reproduce the original sound with high fidelity, as disclosed in the Japanese patent application which was laid open to public inspection under the publication No. 2 (1990)-71464, hereinafter called "prior application". The invention of this prior application was invented by the inventors of the present application.

In this improved equalizer as described above, an input audio signal is divided into an audio signal corresponds to low compass, an audio signal corresponds to medium compass and an audio signal corresponds to high compass. And this improved equalizer includes an audio signal processing circuit for the audio signal corresponds to low compass, which contains two transformers connected in series, an audio signal processing circuit for the audio signal corresponds to medium compass, which contains a capacitor and a resistor connected in series, and an audio signal processing circuit for the audio signal corresponds to high compass, which contains a capacitor and an amplifier connected in series, those different audio signal processing circuits being connected in parallel, and having an input terminal coupled thereto and an output terminal coupled thereto via an amplifier.

The stereo equalizer as described above includes two equalizers as described above, each equalizer including two shunt circuits, the one contains a resistor coupled to the junction between the capacitor and resistor in the audio signal processing circuit for the audio signal corresponds to medium compass in the equalizer, and the other contains a resistor and a capacitor connected in series and coupled to the junction between the capacitor and amplifier in the audio signal processing circuit for the audio signal corresponds to high compass in the equalizer. Those two shunt circuits are grounded to the earth through a common variable resistor.

According to the above improvements, input audio signals having the different audio signals correspond to the different compass of sound may pass through the respective audio signal processing circuits that process the corresponding input audio signals for providing the respective outputs that may be transmitted to the speaker system with each respective velocity or transmission time so that the sound of low compass can reach the listener's location at the same time as the other sounds of medium and high compass. In this way, the time delay caused by the sound of low compass that is traveling to the listener's location may be offset to match the sound of high and medium compass traveling to the listener's location. The original sound may be reproduced with the high fidelity. In particular, the stereo equalizer system including the two equalizers may increase the spreadability of the reproduced sound as well as improve the depth of the reproduced sound to some degree.

However, the spreadability and depth of the reproduced sound cannot be improved any further according to the conventional stereo equalizer system.

SUMMARY OF THE INVENTION

The object of the present invention is therefore to provide an audio signal amplifier device that can further increase and improve the spreadability and depth of the reproduced output sound.

According to one aspect of the present invention, the audio signal amplifier device includes a low compass controlling circuit containing a plurality of transformers connected in series, a medium compass controlling circuit containing a capacitor and a resistor connected in series, and a high compass controlling circuit containing a capacitor and an amplifier connected in series, those three different compass controlling circuits being connected in parallel to form a parallel compass controller circuit. Two parallel compass controller circuits may be connected in series through an pre-amplifier. The audio signal amplifier device thus constructed can improve the spreadability and depth of the reproduced output sound further, as compared with the configuration of the prior application. The reproduced sound can be nearly as true as the original and natural sound.

When the audio signal amplifier device according to the present invention is actually used, the low compass controlling circuit containing the in-series transformers, the medium compass controlling circuit containing the in-series capacitor and resistor, and the high compass controlling circuit containing the in-series capacitor and amplifier may be coupled in parallel. This completes the parallel compass controller circuit as described above. Then, two parallel compass controller circuits may be connected in series through the pre-amplifier. One parallel compass controller circuit may function as the post-stage compass controller that may be coupled with an output transformer through the pre-amplifier, and the other may function as the pre-stage compass controller that may be coupled with an input transformer through the pre-amplifier. In processing the stereo audio signals, it may be understood that two audio signal amplifier devices according to the present invention may be provided.

In the parallel compass controller circuit, as described above, the input audio signals having the different audio signal components such as an audio signal corresponds to a sound of low compass, an audio signal corresponds to a sound of medium compass and an audio signal corresponds to a sound of high compass pass in parallel through the low compass controlling circuit, the medium compass controlling circuit and the high compass controlling circuit, and those input audio signals are processed in the appropriate circuits so that they can be transmitted successively to the speaker system with the different velocities, that is to say with the different transmission time. Specifically, the low audio signal component which passes through the low compass controlling circuit 1 is controlled so that a signal component corresponds to the sound of low compass can be transmitted and can reach the speaker system faster than a signal component corresponds to the sound of medium compass which passes through the medium compass controlling circuit 2 reaches the speaker system, and the medium audio signal component which passes through the medium compass controlling circuit 2 is controlled so that a signal component corresponds to the sound of medium compass can be transmitted and can reach the speaker system faster than a signal component corresponds to the sound of high compass which passes through the high compass controlling circuit 3 reaches the speaker system.

In the speaker system, the speaker that produces the sound of low compass is designed to contain the elements, such as the cone, voice coils and the like, that have the greater masses and therefore the greater inertia. Therefore the speaker which reproduce the sound of low compass, the time required to convert the input audio signal into the audible sound of low compass will be the longer. That is, the time delay is the greater at the speaker which reproduces the sound of low compass.

According to the present invention, the time difference that occurs for converting the input audio signal corresponds to the sound of low compass into the sound of low compass in relation to the sound of medium compass and high compass at the speaker system can be offset by transmitting the audio signal corresponds to the sound of low compass to the speaker system through the low compass controlling circuit 1 faster than the audio signals which correspond to the sound of medium and high compass. So that, the sound nearly as true as the original sound can be reproduced at the listening point.

The two parallel compass controller circuits that are connected in series through the pre-amplifier. The pre-amplifier amplifies the audio signals which correspond to the sounds of low, medium and high compasses respectively and controlled by the pre-stage compass controller to have each respective different velocity and different transmission time. So that the spreadability and depth of the reproduced sound after the post-stage compass controller are improved and increased.

In accordance with the present invention, the velocity with which the input audio signals having the different compass of sound may be varied in passing through each respective circuit to the speaker system, depending upon the different compass of sound so that the time delay of converting and reproducing the sound of low compass which is caused at the speaker system can be offset, thereby reproducing the sound as true as the original sound.

Thus, by connecting the two parallel compass controller circuits in series through the pre-amplifier, the spreadability and depth of the reproduced sound can be increased further, and the original sound can be reproduced as truely as possible.

As the pre-amplifier exists between the first parallel compass controller circuit and the second parallel compass controller circuit, the pre-amplifier circuit or its circuit characteristics may be adjusted to the particular needs of the listener. For example, if the spreadability and depth of the reproduced sound are to be harmonized, either of the spreadability and depth may have the primary importance, or both may have equal importance. Thus, the spreadability and/or depth may be adjusted to meet the needs of the listener.

BRIEF DESCRIPTION OF DRAWINGS

Those and other objects, advantages, and features of the present invention will become more apparent from the detailed description of the preferred embodiments of the present invention that follows with reference to the accompanying drawings, in which:

FIG. 5(a) depicts the pictorial, conceptual image of the reproduced sound in the conventional sound reproduction technique;

FIG. 5(b) also depicts the pictorial, conceptual image of the reproduced sound in the prior application;

FIG. 5(c) depicts the pictorial, conceptual image of the sound reproduced by using the embodiment of the present invention;

FIG. 7 is the diagram showing the waveforms of the audio signal reproduced by the system of FIG. 6 and received at the listening point;

FIG. 8 shows the differences between the recording systems according to the present invention and according to the conventional art by comparing the two; and FIGS. 9(a) and 9(b) are circuit diagrams showing the circuit arrangement in the recording system according to another embodiment of the present invention.

DETAILS OF THE BEST PREFERRED EMBODIMENTS

Referring now to FIGS. 1 through 4, a preferred embodiment of the present invention is described.

Figure 1:
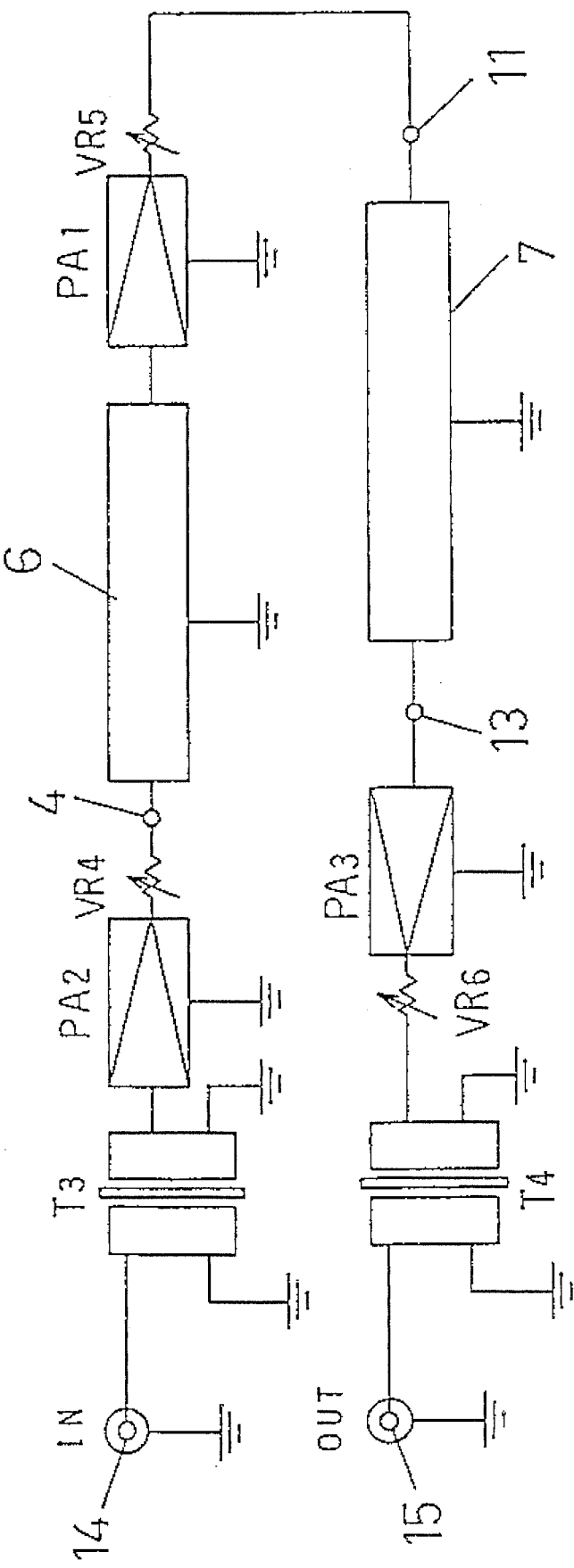
FIG. 1 is a block diagram illustrating the circuit arrangement according to a preferred embodiment of the present invention.
Figure 2:
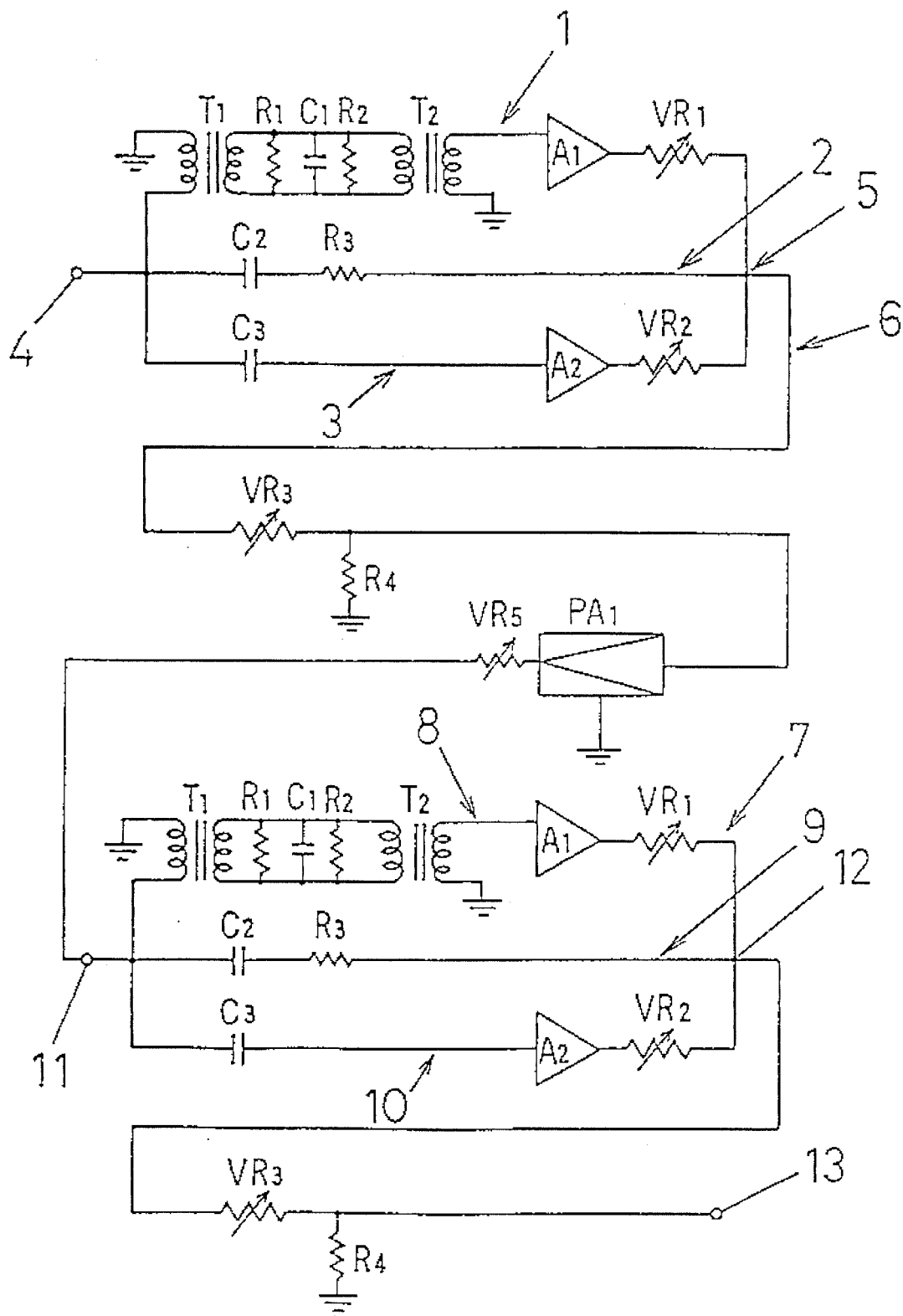
FIG. 2 is a circuit diagram showing the parallel compass controlling circuit according to the above preferred embodiment.

Referring first to FIG. 1, there is a block diagram showing the whole circuit arrangement (one channel) according to the preferred embodiment of the present invention. In FIG. 2, there are different audio signal controlling circuits, including a controlling circuit 1 which controls an audio signal corresponds to a sound of low compass, hereinafter called "low compass controlling circuit 1", a controlling circuit 2 which controls an audio signal corresponds to a sound of medium compass, hereinafter called "medium compass controlling circuit 2", and a controlling circuit 3 which controls an audio signal corresponds to a sound of high compass, hereinafter called "high compass controlling circuit 3". The low compass controlling circuit 1 includes two transformers $T_1$, $T_2$ connected in series, the circuit formed by the transformers $T_1$, $T_2$ including resistors $R_1$, $R_2$ and a capacitor $C_1$. A low pass filter is thus completed. The secondary winding of the transformer $T_2$ has its one end grounded to the earth, with its other end coupled with the input of an amplifier $A_1$ whose output is coupled with a variable resistor $VR_1$. The primary winding of the transformer $T_1$, has its one end grounded to the earth, with its other end connected to an input terminal 4.

The medium compass controlling circuit 2 includes a capacitor $C_2$ and a resistor $R_3$ connected in series, the capacitor $C_2$ being coupled with the input terminal 4.

The high compass controlling circuit 3 includes a capacitor $C_3$, an amplifier $A_2$ and a variable resistor $VR_2$ connected in series, in which one end of the capacitor $C_3$ is coupled with the input terminal 4.

The low compass controlling circuit 1, the medium compass controlling circuit 2 and the high compass controlling circuit 3 have the respective outputs connected in parallel at the junction 5. The junction 5 is grounded through a variable resistor $VR_3$ and a resistor $R_4$, completing a first parallel compass controller circuit 6. The junction between the variable resistor $VR_3$ and resistor $R_4$ is connected in series with a pre-amplifier $PA_1$ and a variable resistor $VR_5$, whose output is coupled to an input terminal 11 of a second parallel compass controller circuit 7 which is described below.

The second parallel compass controller circuit 7 includes a low compass controlling circuit 8, a medium compass controlling circuit 9, and a high compass controlling circuit 10, as described below. The circuits 8, 9 and 10 have the respective outputs connected in parallel at the junction 12. The junction 12 is grounded through a variable register $VR_3$ and register $R_4$. The junction between the variable $VR_3$ and resistor $R_4$ provides output 13.

The low compass controlling circuit 8 includes two transformers $T_1$, $T_2$ connected in series, the circuit formed by the transformers $T_1$, $T_2$ including resistors $R_1$, $R_2$ and a capacitor $C_1$ connected in parallel. This completes a low pass filter. The secondary winding of the transformer $T_2$ as its one end grounded to the earth, with its other end coupled with the input of an amplifier $A_1$, whose output is coupled with a variable resistor $VR_1$. The primary winding of the transformer $T_1$ has its one end grounded to the earth, with the other end coupled with an input terminal 11.

The medium compass controlling circuit 9 includes a capacitor $C_2$ and a resistor $R_3$ connected in series, the capacitor $C_2$ being coupled with the input terminal 11.

The high compass controlling circuit 10 includes a capacitor $C_3$, an amplifier $A_2$ and a variable resistor $VR_2$ connected in series, with one end of the capacitor $C_3$ being coupled with the input terminal 11. The outputs of those circuits are connected at a common junction 12 which is coupled with an output terminal 13 through a variable resistor $VR_3$. The output terminal 13 is grounded through a resistor $R_4$.

In FIG. 1, the first (pre-stage) parallel compass controller circuit 6 has its input coupled in series with an input terminal 14 through a variable resistor $VR_4$, a pre-amplifier $PA_2$ and an input transformer $T_3$.

The second (post-stage) parallel compass controller circuit 7 has its output coupled with an output terminal 15 through a pre-amplifier $PA_3$, a variable resistor $VR_6$ and an output transformer $T_4$ connected in series.

Figure 3:
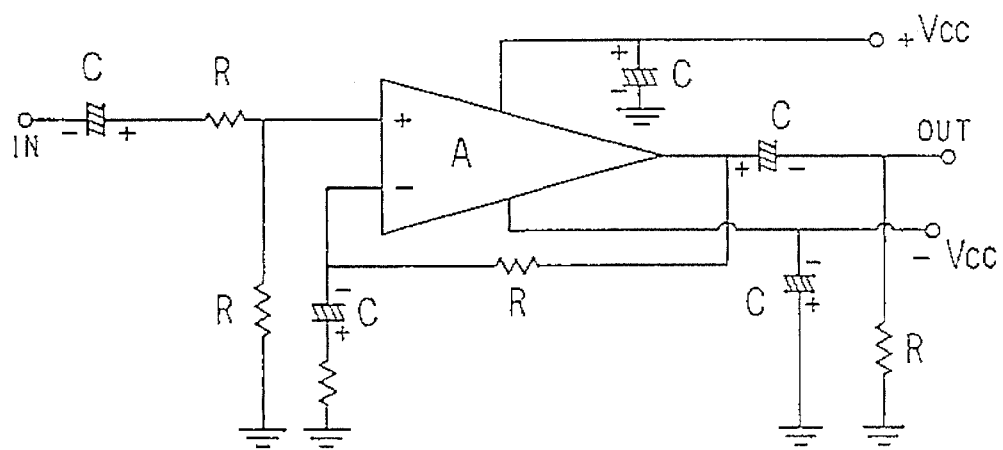
FIG. 3 is a circuit diagram showing the pre-amplifier according to the preferred embodiment shown in FIG. 1.

The pre-amplifiers $PA_1$, to $PA_3$ may be implemented by using the usual amplifiers as shown in FIG. 3. Preferably, those amplifiers should be of the flat amplifier type that provides uniform gain over the broad frequency range and has a high signal-to-noise (S/N) ratio. In FIG. 3, a capital letter A refers to the amplifier which may be the operational amplifier, like the amplifiers $A_1$ and $A_2$. Similarly, R refers to the resistor, and C refers to the capacitor. The input/output level and the input/output impedance may be matched between the first and second parallel compass controller circuits 6 and 7.

In operation, an input audio signal, which includes audio signal components corresponding to each respective compasses, such as low, medium and high compasses of sound, is applied from the input terminal 14 through input transformer $T_3$, pre-amplifier $PA_2$ and variable resistor $VR_4$ to the input terminal 4 of the first parallel compass controller circuit 6. Then, the each audio signal corresponds to respective compasses, such as low, medium and high, proceeds to the respective compass controlling circuit. That is to say, the audio signal component corresponds to a low-pitched sound having low audio frequency is derided and passed through the low compass controlling circuit 1. The audio signal component corresponds to a medium-pitched sound having medium audio frequency is derided and passed through the medium compass controlling circuit 2. The audio signal component corresponds to a high-pitched sound having high audio frequency is derided and passed through the high compass controlling circuit 3.

In the low compass controlling circuit 1, the in-series transformer $T_1$, $T_2$ circuit induces electrical current that carries the audio signal corresponds to low-pitched sound. Thus, this signal component can be transmitted faster than those signal components which pass through the capacitors $C_2$, $C_3$ and resistor $R_3$ in the medium and high compass controlling circuits 2 and 3. When passing through the medium and high compass controlling circuits 2 and 3, the high audio signal component in the input audio signal has its current amplified by the amplifier $A_2$, and the medium audio signal component is not amplified. Thus, the high audio signal component is delayed with respect to the medium audio signal component when being transmitted.

As it may be appreciated from the above description, the input audio signal is applied to the input terminal 4, and passes in parallel through the parallely-connected low, medium and high compass controlling circuits 1, 2 and 3, and is transmitted in the order of the low, medium and high audio signal components.

The audio signals, which transmitted velocities or times have been controlled as the before described, pass through the pre-amplifier $PA_1$. And, each audio signal components are amplified at the same ratio by the pre-amplifier $PA_1$, since $PA_1$ is flat amplifier. The output of the pre-amplifier $PA_1$ is coupled to the input terminal 11 of the second parallel compass controller circuit 7.

In the second parallel compass controller circuit 7, the operation is similar to that for the first circuit 6. Specifically, the input audio signal passes in parallel through the low, medium, and high compass controlling circuits 8, 9 and 10 where the low, medium and high audio signal components are processed as appropriate and transmitted in the order of the low, medium and high audio signal components. As described, the input audio signal passes through the different compass controlling circuits in the two-stage parallel compass controller circuits 6 and 7. Thus, the input audio signals containing the different audio signals correspond to low-, medium-, or high-pitched sounds can be separated clearly and discretely. So that, for the stereo speaker configuration, the spreadability and depth of the reproduced sound can be increased.

The output terminal 13 of the parallel compass controller circuit 7 is connected to the in-series circuit formed by the pre-amplifier $PA_3$, variable resistor $VR_4$ and output transformer $T_4$, which may be connected to the speaker system. Then, the spreadability and depth of any desired tone may be provided from the speaker system.

Specifically, the spreadability and depth of any desired tone may be provided more effectively by adjusting the pre-amplifier $PA_3$ circuit and by adjusting the variable resistor $VR_4$.

Figure 4A:
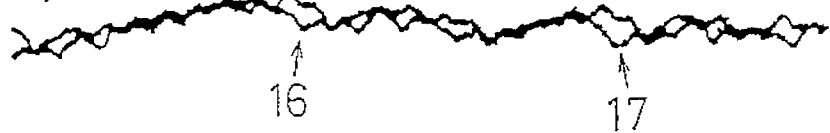
FIG. 4 shows the audio signal waveforms on the oscillograph comparing the present invention with the prior application.
Figure 4B:

FIG. 4 shows output audio signal waveforms obtained when input audio signals of the same nature have been processed and reproduced in accordance with the present invention and in accordance with the prior application. In FIG. 4, the signal waveforms identified as (a) have been obtained according to the prior application (Japanese patent publication No. 2 (1990)-71404), and the signal waveforms identified as (b) have been obtained according to the embodiment of the present invention. The signal waveforms (a) contain reproduced components as indicated by arrows 16, 17, and the signal waveforms (b) contain reproduced components as indicated by arrows 16a, 17a that correspond to the components 16, 17. When the waveforms (a) and (b) are compared, it may be clear that the components 16a, 17a contained in the waveforms (b) are separated more clearly and widely than the respective corresponding components 16, 17 in the waveforms (a). The waveforms (b) contain more complex lines than the waveforms (a), which means that the input audio signals in the case of (b) have been amplified and reproduced as truely as the original sound. In addition, it may be seen that the waveforms (b) contain the low, medium and high audio signal components which are separated and are varying with time, with some time delay being kept relative to each other. Those different components are interlaced in the complicated manner. When the details of the waveforms (a) and (b) are checked by using the magnifier, it may be seen that the waveforms (a) contain unclear, simple curves, while the waveforms (b) contain sharp, complex lines which mean that the sound represented by the input audio signals has been reproduced to details.

FIG. 5(a) through FIG. 5(c) are different pictorial conceptual views illustrating how a reproduced sound has the spreadability and depth. FIG. 5(a) shows the case of the sound reproduced according to the conventional method. It may be seen from FIG. 5(a) that the sounds originating from the various musical instruments have no spreadability and depth when reproduced. FIG. 5(b) shows the case of the sound reproduced according to the method disclosed in the prior application, in the same situation as in FIG. 5(a). It may be seen from FIG. 5(b) that there are some spreadability and depth in the reproduced sound. FIG. 5(c) shows the case of the sound reproduced according to the embodiment of the present invention. It may be seen from FIG. 5(c) that each reproduced sound from each musical instrument has been separated clearly and discretely from the others, and the satisfactory spreadability and depth have been achieved.

Figure 6:
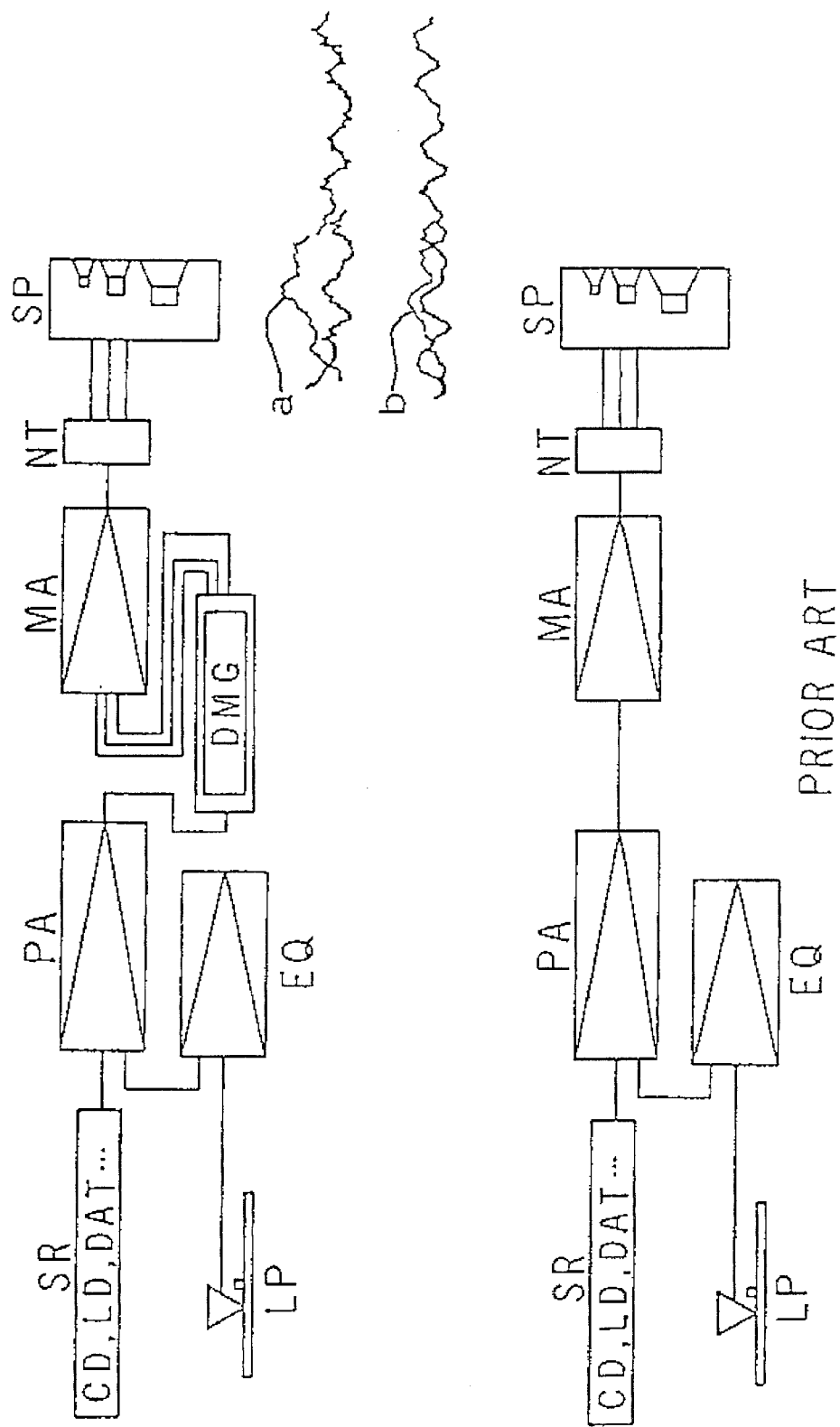
FIG. 6 show the differences between the circuit arrangement in the audio signal reproduction system according to the present invention and the corresponding conventional art circuit arrangement by comparing the two.

Referring now to FIG. 6, the difference between the reproduction of the sounds represented by the input audio signals in the 3-way speaker system according to the present invention and the conventional art by comparing the two is described. In FIG. 6, the circuit arrangement shown in the upper side includes an audio signal amplifier device of the present invention indicated by DMG, and the circuit arrangement shown in the lower side is the conventional one. In FIG. 6, the 3-way speaker system includes 3-way speakers SP, a network circuit NT, a main amplifier MA, a pre-amplifier PA, an equalizer amplifier EQ, a record player LP, and recording sources or mediums SR including compact disk CD, laser disk LD, digital audio tape DAT and audio tape. Furthermore, the system shown in the upper side includes DMG which is the audio signal amplifier device according to the present invention as shown in FIG. 1.

The output waveforms from the main amplifier MA in the upper side system and in the lower side system are also shown in FIG. 6. In FIG. 6, the waveforms indicated by (a) represents the waveforms obtained from the upper side system which includes the audio signal amplifier device according to the present invention, and the waveforms indicated by (b) represents the waveforms obtained from the lower side system according to the conventional art. As seen from the two waveforms (a) and (b), (b) represents the waveforms which are more approximate to those in the natural sound, whereas (a) contains more complicated waveforms.

Then, as shown in FIG. 7, a respective microphone MIC is placed in front of the 3-way speaker systems SP shown in FIG. 6, with a given distance away from the systems SP where the listening point is located, and the audio waveforms generated from the 3-way speaker systems SP are observed. The result shows that the above situation is reversed. In the system including the audio signal amplifier device (DMG) according to the present invention, the waveforms are separated clearly and discretely, and are more approximate to those in the natural sound as identified by (a) in FIG. 7, whereas in the conventional system, the waveforms collapse, and are far from those in the natural sound as identified by (b) in FIG. 7.

The audio signal amplifier device according to the present invention is advantageous in that any user who has no such device can reproduce and hear the natural sound as originally recorded through the amplifier device. Specifically, in recording the sound on tape, compact disk, or laser disk, the audio signals may be amplified and recorded on any of the above recording mediums by using the amplifier device according to the present invention. Any user who does not have the audio signal amplifier device according to the present invention can reproduce and hear the natural sound as originally recorded using said recorded mediums through any amplifier device.

FIG. 8 illustrates the relationship in the above situation. The system shown in the upper part of the figure includes the audio signal amplifier device (DMG) according to the present invention, and the system shown in the lower part is the conventional recording and reproducing system which includes no DMG. That is to say, in the system shown in the upper part of the figure, the natural sound is recorded through DMG. In FIG. 8, MIC is the microphone, AMP is the amplifier circuit, DMG is the audio signal amplifier device according to the present invention, CD and LD ① are the original compact disk and laser disk, respectively, and CD and LD ② are the reproduced versions of the original CD and LD ①. SP is the speaker system.

In FIG. 8, the waveforms of the audio signals appearing at after the amplifier circuit reproduced from the reproduced versions CD and LD ②, and the waveforms appearing at the listening point are shown. As the waveforms show, the waveforms of the audio signals reproduced from CD and LD ② appearing at after the amplifier circuit are varying unsteadily in the system including the DMG circuit shown by (a), whereas the waveforms are varying less unsteadily, and are more approximate to the waveforms of the natural sound in the conventional system shown by (b).

Conversely, when the natural sound is recorded through DMG as shown in the upper part system of FIG. 8, the waveforms appearing at the listening point are more approximate to the waveforms of the natural sound shown by (a). From those waveforms, the clear and discrete sounds may be obtained since the unsteadiness of the waveforms is offset by the time difference between the different audio signals correspond to the different compasses of sound at the speaker system SP. Whereas, in the conventional system, the time difference between the different audio signals correspond to the different compasses of sound which are caused at the speaker system SP affects the waveforms in such a way that the waveforms collapse shown by (b). Therefore, the sound is far from the natural sound.

The present invention provides the following advantages when the sound represented by the stereo audio signals is reproduced by using the audio signal amplifier device according to the present invention:

(1) The sound can be reproduced with high fidelity, and as real as and as live as the original sound. In other words, the sound can be reproduced as true as the sound originally recorded.

(2) The original sound can be reproduced at any home stereo reproduction system using LD or video tape in particular, as if the listener were at the spot where the sound was originally recorded (the sense of the realism). The reproduced sound is as powerful as the sound that would be heard at the cinema theater.

(3) The sound having the same spreadability as the natural sound can be reproduced without varying the fixed point of the sound. This system is essentially different from any of the surround system, the ambience system, the multi-system, and the digital system. Those systems are designed to rotate the phases of the sound by using multiple speakers, and to delay or quicken the sound from each speaker, thereby simulating the natural sound as if the listener were at the spot where the original sound was recorded. The sound produced from each speaker is artificial and non-natural in that the sound from the middle speaker is missing, or the middle sound image may become the sound far from the original sound because it sounds like pulled or swollen. Thus, the sound may be hard to hear or tiring. As opposed, the sound reproduced according to the present invention provides the spread of the natural sound, and the listener will not become tired.

(4) The present invention provides the excellent fixed point and separability of the different tones. The listener can identify the position of each different musical instrument easily and accurately, and can identify each sound from each instrument separately. When the sounds come from the orchestra, the listener can identify the thickness of the sound from each instrument in the orchestra, and can identify each different instrument by hearing each sound. The first fiddler is usually located on the left side of the orchestra as viewed from the audience. Then, suppose that when the listener is hearing the sound from the speaker system using the audio signal amplifier device of the present invention in his or her room, and is then moving to the left side. In this case, the sound is also heard from the left side speaker. In opposition, in the usual audio system, the sound from the first fiddler becomes inaudible as the listener is moving to the right side in the same situation. In the usual sound reproduction system, the left-hand and right-hand speakers are directed inwardly in order to avoid the above problem. In the sound reproduction system that incorporates the present invention, the left-hand and right-hand speakers may be placed to face the listener right and in parallel.

(5) All sounds can be heard to be as transparent as the natural sounds. The sounds can be pleasing to the listener even if the listener hears the sounds for an extended period of time.

(6) The reproduction system incorporating the present invention has the wide dynamic range which can provide plentiful volume of all sounds from bass tone to ultra high pitch tone.

(7) It can reproduce the depth and profoundness of the sound with high fidelity.

(8) For the bass tone in particular, the listener can have the impression of the speediness as if the bass tone is being ejected from the speaker, and is coming closer to the listener. As the result, the rhythmical music can be reproduced.

(9) Those features listed above combine together to convey the true sentiment of the performers to the listener. Similarly, the narration can be conveyed to the listener as if the narrator were in front of the listener. Thus, the present invention may be applied for any educational programs.

(10) The original sound recorded on the recording mediums, such as CD, LD, DAT, video tape, cassette tape, LP, movies talkie, and the like, by using the sound recording system incorporating the present invention may be reproduced by using the usual sound reproduction system. All of the features (1) to (9) listed above may be provided regardless of the type of the sound reproduction system used.

FIGS. 9(a) and 9(b) show the configuration of the recording system incorporating the present invention, respectively. In FIG. 9(a) and 9(b), MIC is the microphone, MX is mixing amplifier, CD and LD are original disk, and DMG is the audio signal amplifier device according to the present invention.

The configuration in FIG. 9(a) is simpler, but the configuration in FIG. 9(b) is preferred because of the quality of the sound that can be recorded. For the configuration in FIG. 9(b), the DMG circuit may be adjusted to the characteristics of each respective musical instrument until the most ideal sounds can be obtained, and the sounds from those musical instruments may then be mixed through the mixer. The reproduction versions of the original soft copies, such as CD, LD, LP and the like, on which the original sound has been recorded in this way may provide the musical softs which give the listener the sense of the realism and rhythm. It is noted that in the conventional CD recording, any tone having the inaudible frequency range is often cut. The sound that is heard by humans every day contains such inaudible compasses, but humans are supposed to be able to sense the reality of the sound by realizing it physically. In this situation, if the sound is recorded through the DMG circuit according to the present invention in order to include broader frequency range compasses, the realism of the reproduced sound may be enhanced further. Examples of the inaudible frequency range compasses include the vibrations caused by vehicles running on the highways. Those vibrations are the sound which can be realized physically but cannot be heard.

Although the present invention has been described so far by referring to the typical preferred embodiments of the present invention, it should be understood that various changes and modifications may be made within the spirit and scope of the invention as defined in the appended claims.

What is claimed is:

1. An audio signal amplifier device, comprising:
    first parallel compass controller circuit means including:
        low compass controlling circuit means having a plurality of transformers connected in series;
        medium compass controlling circuit means having a capacitor and a resistor connected in series; and
        high compass controlling circuit means having a capacitor and an amplifier connected in series, wherein said three compass controlling circuit means are connected in parallel; and
    second parallel compass controller circuit means including:
        low compass controlling circuit means having a plurality of transformers connected in series;
        medium compass controlling circuit means having a capacitor and a resistor connected in series; and
        high compass controlling circuit means having a capacitor and an amplifier connected in series, wherein said three compass controlling circuit means are connected in parallel; and
    said first and second parallel compass controller circuit means being connected in series through a pre-amplifier.

2. An audio signal amplifier device, comprising:
    first parallel compass controller circuit means including:
        low compass controlling circuit means having a plurality of transformers connected in series;
        medium compass controlling circuit means having a capacitor and a resistor connected in series; and
        high compass controlling circuit means having a capacitor and an amplifier connected in series, wherein said three compass controlling circuit means are connected in parallel; and
    second parallel compass controller circuit means including:
        low compass controlling circuit means having a plurality of transformers connected in series;
        medium compass controlling circuit means having a capacitor and a resistor connected in series; and
        high compass controlling circuit means having a capacitor and an amplifier connected in series, wherein said three compass controlling circuit means are connected in parallel; and
    said first and second parallel compass controller circuit means being connected in series through a pre-amplifier, wherein either of said first and second parallel compass controller circuit means acts as the post-stage compass controller circuit that is coupled with output transformer means through a pre-amplifier and the other circuit acts as the pre-stage compass controller circuit that is coupled with input transformer means through a pre-amplifier.

3. An apparatus for recording audio signals on recording mediums such as compact disk, laser disk and the like, said apparatus including an audio signal amplifier device that comprises:
    first parallel compass controller circuit means including:
        low compass controlling circuit means having a plurality of transformers connected in series;
        medium compass controlling circuit means having a capacitor and a resistor connected in series; and
        high compass controlling circuit means having a capacitor and an amplifier connected in series, wherein said three compass controlling circuit means are connected in parallel; and
    second parallel compass controller circuit means including:
        low compass controlling circuit means having a plurality of transformers connected in series;
        medium compass controlling circuit means having a capacitor and a resistor connected in series; and
        high compass controlling circuit means having a capacitor and an amplifier connected in series, wherein said three compass controlling circuit means are connected in parallel; and
    said first and second parallel compass controller circuit means being connected in series through a pre-amplifier, wherein either of said first and second parallel compass controller circuit means acts as the post-stage compass controller circuit that is coupled with output transformer means through a pre-amplifier and the other circuit acts as the pre-stage compass controller circuit that is coupled with input transformer means through a pre-amplifier.

* * * * *